United States Patent
Lin et al.

(10) Patent No.: US 10,276,077 B2
(45) Date of Patent: Apr. 30, 2019

(54) DRIVING CIRCUIT

(71) Applicant: Raydium Semiconductor Corporation, Hsinchu (TW)

(72) Inventors: Yu-Chun Lin, Kinmen County (TW); Ching-Chuan Chiu, Hsinchu (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 89 days.

(21) Appl. No.: 15/414,820

(22) Filed: Jan. 25, 2017

(65) Prior Publication Data
US 2017/0221400 A1  Aug. 3, 2017

(30) Foreign Application Priority Data
Jan. 29, 2016 (TW) .............. 105102867 A

(51) Int. Cl.
G09G 3/00 (2006.01)
G05F 1/46 (2006.01)
G01R 31/00 (2006.01)

(52) U.S. Cl.
CPC ............. G09G 3/006 (2013.01); G01R 31/00 (2013.01); G05F 1/46 (2013.01); G09G 2310/0291 (2013.01); G09G 2310/06 (2013.01)

(58) Field of Classification Search
CPC .......... G09G 3/006; G09G 2310/0291; G09G 2310/06
See application file for complete search history.

(56) References Cited

U.S. PATENT DOCUMENTS

| 2015/0130776 A1* | 5/2015 | Lin | G09G 3/3685 345/205 |
| 2015/0198641 A1* | 7/2015 | Moon | G02F 1/0121 324/537 |
| 2016/0087627 A1* | 3/2016 | Jang | H03K 17/6871 345/214 |

* cited by examiner

Primary Examiner — Carolyn R Edwards

(57) ABSTRACT

A driving circuit includes an amplifier circuit, a control path, and a control circuit. The control path is coupled to the amplifier circuit. The control circuit is coupled to the control path. The control circuit receives a control signal and outputs a modulation signal to the control path according to the control signal.

6 Claims, 5 Drawing Sheets

DRIVING CIRCUIT

BACKGROUND OF THE INVENTION

1. Field of the Invention

The present invention relates to a driving circuit; particularly, the present invention relates to a source driving circuit utilized in a display.

2. Description of the Prior Art

A driving circuit is completed after the test process is performed to confirm the driving circuit is able to work properly. Taking a display device as an example, the display device has driving circuits including a source driving circuit, a gate driving circuit, etc. Since the driving circuit will directly affect the display quality, the test process for the driving circuit becomes more important as the display technology advances. Taking the test process for the source driving circuit as an example, because the load in a test machine is very small, the source driving circuit will generate an unstable output voltage when an output end of the source driving circuit is connected to the test machine. Please refer to an output voltage-time diagram illustrated in FIG. 1A. As shown in FIG. 1A, in the test process, after a period of time, the output voltage of a traditional driving circuit generates a ripple-like unstable wave instead of reaching to the stable status. This situation will affect the test process.

To address the problem mentioned above, the traditional technique utilizes two kinds of methods: one method is to have capacitance compensation in the operational amplifier of the source driving circuit; the other method is to have a resistor coupled to the output stage of the source driving circuit. However, the two methods will decrease response speed of the output voltage of the source driving circuit. Please refer to FIG. 1B that illustrates the output voltage-time diagram related to the output stage of the source driving circuit coupled to the resistor. As shown in FIG. 1B, compared to the slew rate of the source driving circuit without coupling the resistor (depicted as broken line), the slew rate of the output voltage (depicted as solid line) is notably decreased when the source driving circuit is coupled to the resistor. Consequently, when the source driving circuit is assembled to the display panel after the test process, the display device may have distorted output signals. Therefore, the structure of the traditional driving circuit needs to be improved.

SUMMARY OF THE INVENTION

It is an object of the present invention to provide a driving circuit which can provide stable output voltage in test mode and normal mode.

A driving circuit includes an amplifier circuit, a control path, and a control circuit. The control path is coupled to the amplifier circuit. The control circuit is coupled to the control path. The control circuit receives a control signal and outputs a modulation signal to the control path according to the control signal.

DETAILED DESCRIPTION OF THE PREFERRED EMBODIMENT

The present invention provides a driving circuit having at least one control path that is controllable according to a control signal so as to improve the waveform of output voltage when the driving circuit is under the test process, and improve the slew rate of the output voltage when the driving circuit in normal use. The driving circuit of the present invention can be utilized in a source driver of the display, but not limited thereto. The driving circuit can be employed in other integrated circuits.

Figure 1A:
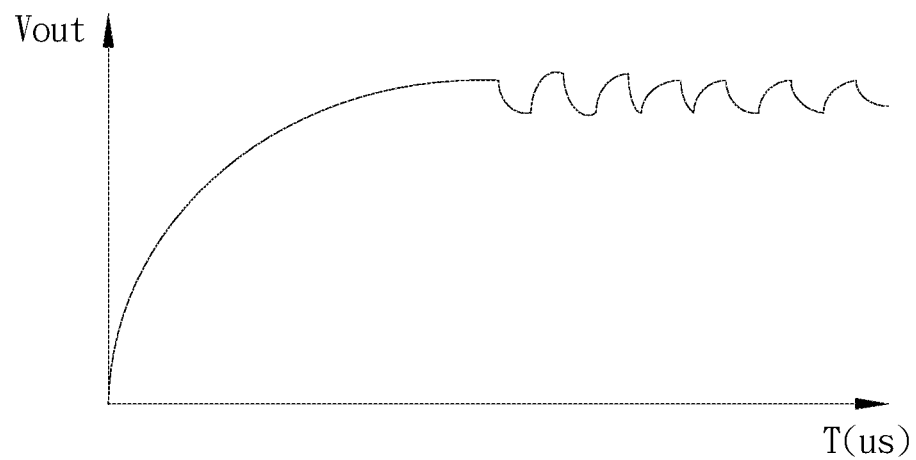
FIG. 1A is an output voltage-time diagram of a traditional driving circuit.
Figure 1B:
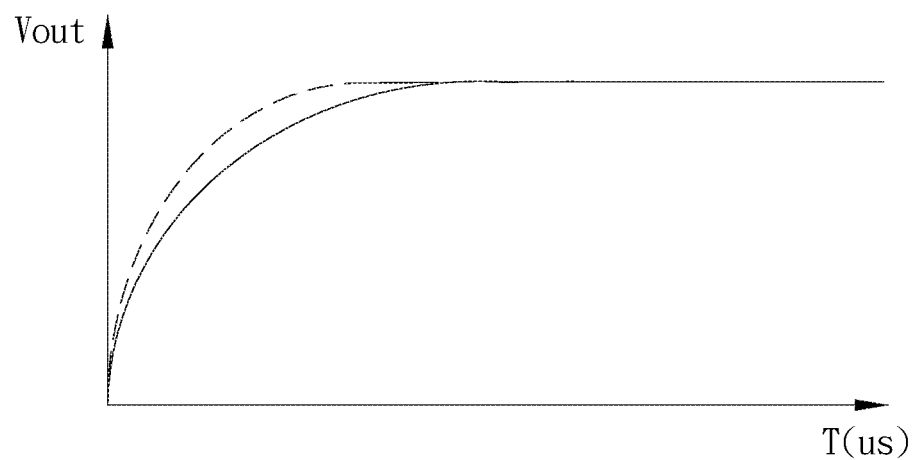
FIG. 1B is another output voltage-time diagram of a traditional driving circuit.
Figure 2:
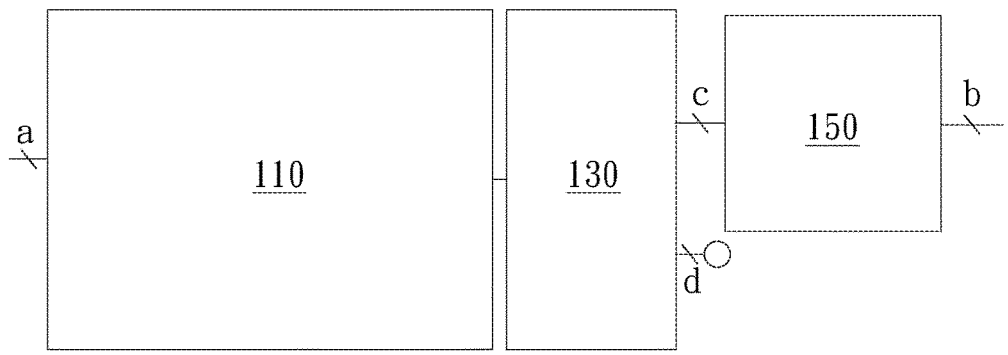
FIG. 2 is a schematic view of an embodiment of the driving circuit of the present invention.

FIG. 2 is a schematic view of an embodiment of the driving circuit 100 of the present invention. As shown in FIG. 2, the driving circuit 100 includes an amplifier circuit 110, a control path 130, and a control circuit 150. The control path 130 is coupled to the amplifier circuit 110. The amplifier circuit 110 receives an input signal (a) and generates an output signal (d) via the control path 130. For example, the input signal (a) and the output signal (d) can be a voltage signal. Another end of the control path 130 is coupled to the control circuit 150. The control circuit 150 receives a control signal (b) and outputs a modulation signal (c) to the control path 130 according to the control signal (b).

In the test process, the control signal (b) can be an alternating current signal. The control circuit 150 receives and decodes the control signal (b) and then outputs the modulation signal (c). Intrinsic parameters of the control path 130 (such as resistance value) can be changed by using the modulation signal (c). In other words, the intrinsic parameters are adjustable. For example, the control path 130 can have elements such as MOSFET, BJT, or resistors manufactured through CMOS processes to achieve required resistance value. After the amplifier circuit 110 receives the input signal (a) and transfers it to the control path 130, the output signal (d) is modulated by changing the intrinsic parameters of the control path 130. As such, the aforementioned technique can be utilized in the source driver of the display to allow the output voltage to achieve the stable status by changing the intrinsic parameters of the control path 130 during the test process.

Figure 3:
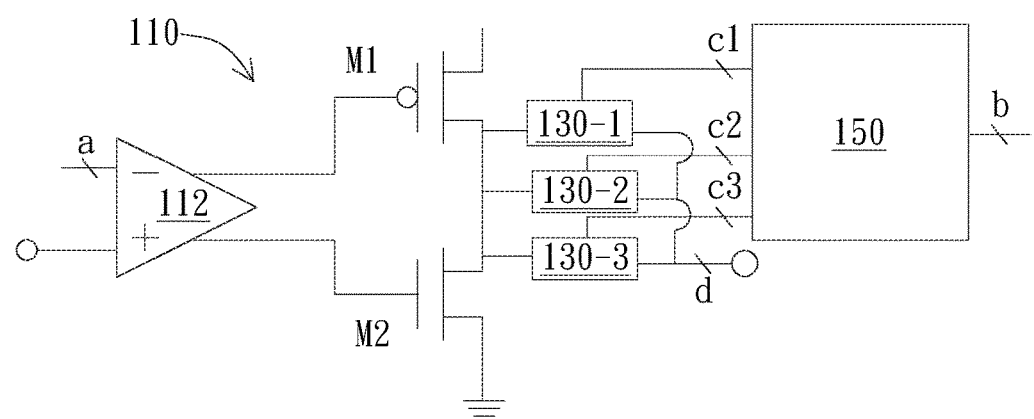
FIG. 3 is a schematic view of another embodiment of the driving circuit of the present invention.

FIG. 3 is a schematic view of another embodiment of the driving circuit of the present invention. As shown in FIG. 3, the amplifier circuit 110 includes an operation amplifier unit 112, a first transistor (M1), and a second transistor (M2). The operation amplifier unit 112 is connected to a plurality of control paths (130-1~130-3) through the first transistor (M1) and the second transistor (M2). Another end of the plurality of control paths (130-1~130-3) is connected to the control circuit 150. The operation amplifier unit 112 receives and transfers the input signal (a) to the first transistor (M1) and the second transistor (M2), and generates the output signal (d) via the plurality of control paths (130-1~130-3). The control circuit 150 receives and decodes the control signal (b) and determines the activation of the modulation signals (c1, c2, c3) according to the control signal (b). Then the modulation signals (c1, c2, c3) are generated and outputted to the control paths (130-1,130-2, 130-3), respectively. For example, after the amplifier circuit 110 receives the input signal (a) and transfers it to the control paths (130-1,130-2, 130-3), the output signal (d) is modulated by changing the intrinsic parameters of the control paths (130-1,130-2, 130-3). The control paths (130-1,130-2, 130-3) preferably have different modulating ranges. For example, the control paths have resistance values in different order of magnitude, representing different modulating ranges so as to increase accuracy in modulating the output signal.

In other embodiments, each control path can have the same modulating range, such as the resistance values of the same order of magnitude. The control signal can be designed to activate one or more control paths to determine the number of modulation signals to be outputted. Besides, the number of the control paths can be changed depending on requirement. For example, the number of control paths having the same modulating range is increased from three to five, wherein the additional two control paths can serve as backup control paths. As such, the aforementioned technique can be utilized in the source driver of the display to allow the output voltage to achieve the stable status by changing the intrinsic parameters of the different control paths during the test process. In addition, compared to the single control path case, using multiple control paths can avoid inconvenience derived from test process shutdown when the control path is breakdown.

Figure 4:
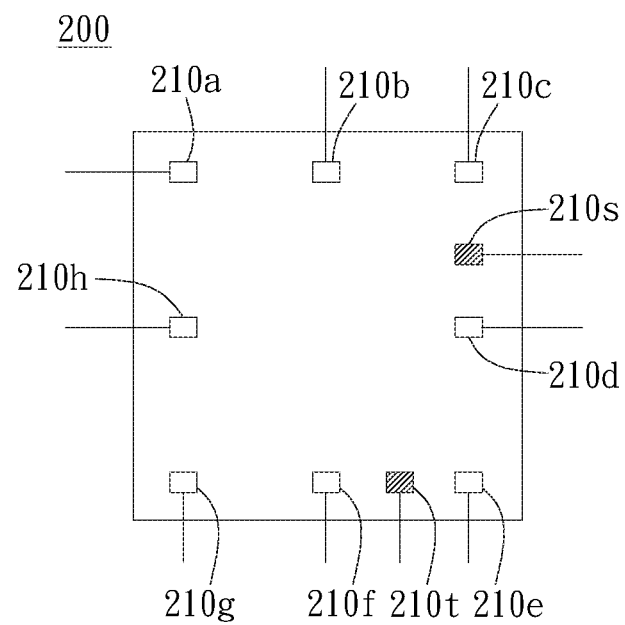
FIG. 4 is a schematic view of a chip utilizing the driving circuit of the present invention.

FIG. 4 is a schematic view of a chip 200 utilizing the driving circuit of the present invention. As shown in FIG. 4, the chip 200 includes a plurality of contact pads. The plurality of contact pads includes initial contact pads (210a~210h) made according to an original applied specification. For example, the initial contact pad can be a contact pad of shift signal, a contact pad of clock signal, a contact pad of a latch signal, or a contact pad of a polar signal that is utilized to receive a shift signal, a clock signal, a latch signal, or a polar signal to be provided to the driving circuit in a normal mode. Besides, in order to perform the test process on the driving circuit inside the chip 200 when the chip 200 has been made, in addition to the initial contact pads, some test contact pads (210s, 210t, referring to slant line boxes in FIG. 4) are provided. As such, the aforementioned control circuit can receive the control signal through the pin of the test contact pad 210s and/or the pin of the test contact pad 210t.

Figure 5A:
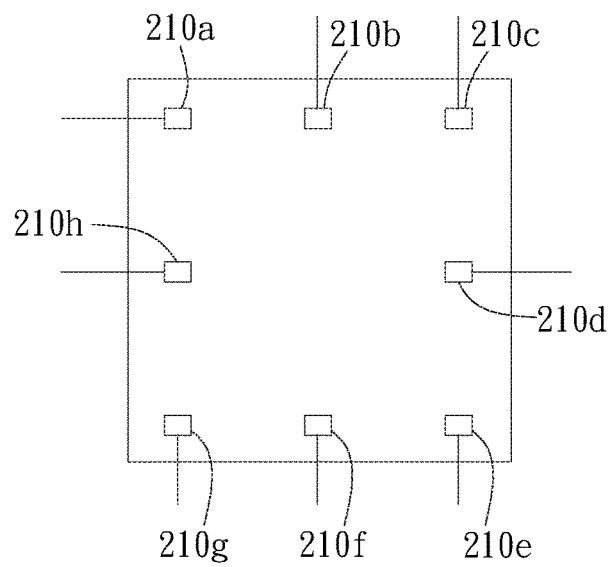
FIG. 5A is a schematic view of another chip utilizing the driving circuit of the present invention.
Figure 5B:
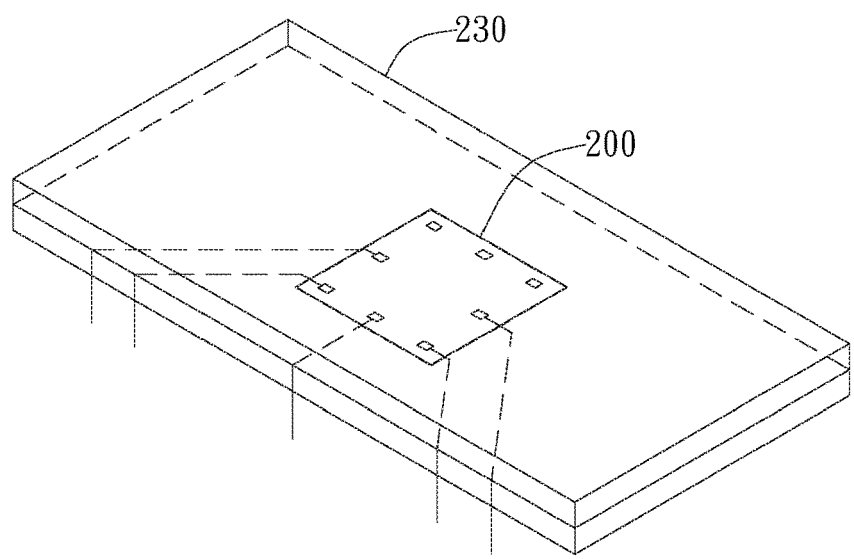
FIG. 5B is a schematic view of the chip in a package structure.

FIG. 5A is a schematic view of another chip 200 utilizing the driving circuit of the present invention. As shown in FIG. 5, the chip 200 includes initial contact pads (210a~210h) made according to the original applied specification. In a test mode, the control signal can be provided to the driving circuit directly from initial contact pads (210a~210h). As such, the test process can be done by utilizing the original contact pads without adding other contact pads, and the manufacture cost can be saved. Please refer to FIG. 5B which illustrates a schematic view of the chip in a package structure. As shown in FIG. 5B, the chip 200 is encapsulated by a package structure 230, and the pins of each initial contact pads protrude from the package structure 230. The control circuit can receive the control signal from the pins of the initial contact pads. As such, in order to meet circuit design requirement, the structure adopting the initial contact pads to receive the control signal has the advantage of convenient access to perform test process. For example, when the pins of the test contact pads are not allowed to protrude from the package structure, the test contact pads cannot be utilized to receive the control signal. In other words, the approach using initial contact pads to receive the control signal is suitable for an unpackaged chip and also suitable for a packaged chip.

Figure 6A:
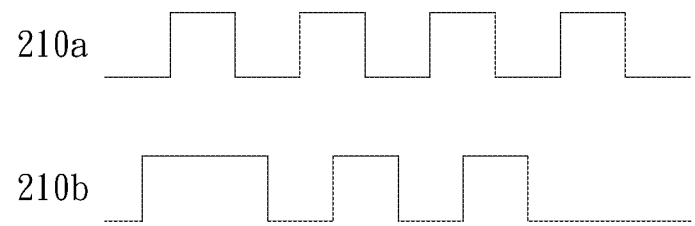
FIG. 6A and FIG. 6B are schematic views of a control signal and a modulation signal.
Figure 6B:
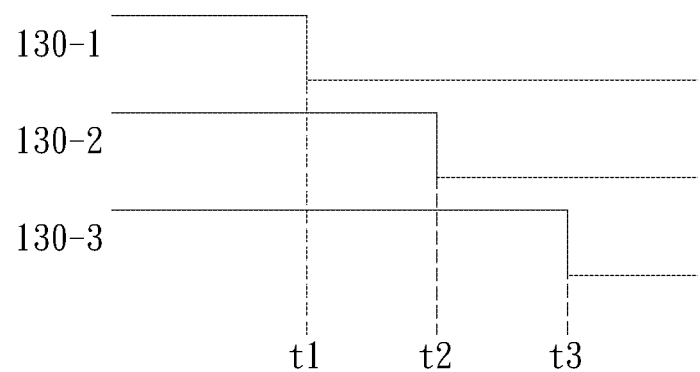

FIG. 6A and FIG. 6B are schematic views of the control signal and the modulation signal. For example, as shown in FIG. 6A, the driving circuit can receive a set of control signals from the initial contact pad 210a and the initial contact pad 210b and enter into the test mode. After the control signal is decoded by the control circuit, the modulation signal is generated to modulate the control paths (130-1~130-3, referring to FIG. 6B) according to the control signal. It is noted that the modulation signal can have different timing to satisfy different test requirement. As shown in FIG. 6B, after the control signal is decoded by the control circuit, the control path 130-1, the control path 130-2, and the control path 130-3 are turned on for a while (from activation to time (t1)) to obtain the stable output signal. Next, in the period from time (t1) to time (t2), the control path 130-1 is turned off to test the variation of the output signal when the control path 130-2 and the control path 130-3 are turned on. And then in the period from time (t2) to time (t3), the control path 130-2 is turned off to test the variation of the output signal when the control path 130-3 is turned on. After time (t3), the control path 130-1, the control path 130-2, and the control path 130-3 are turned off. In this stage, the resistance value in each control path (130-1~130-3) is turned to a minimum value and enters into the normal mode so as to increase the slew rate of the output signal and avoid signal distortion. It is appreciated that the control sequence to turn on/turn off the control paths (130-1~130-3) mentioned above is an example, and the control sequence can be changed depends on the test requirement. To sum up, compared to the structure of the traditional driving circuit, the driving circuit of the present invention can provide stable output voltage in the test mode and in the normal mode, and the slew rate of the output signal is increased by modulating the control paths.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A driving circuit, comprising:
    an amplifier circuit;
    a plurality of control paths coupled to the amplifier circuit, wherein the plurality of control paths are different in modulating range of resistance; and
    a control circuit coupled to the plurality of control paths; in a test mode, the control circuit receiving a control signal and generating a plurality of modulation signals to the plurality of control paths according to the control signal; a resistance value in each control path is changed according to the plurality of modulation signals; in a normal mode, the resistance value in each control path is turned to a minimum value by the control circuit.

2. The driving circuit of claim 1, wherein the driving circuit is utilized in a source driver of a display; the amplifier circuit comprises an operation amplifier unit, a first transistor, and a second transistor; the operation amplifier unit is connected to the plurality of control paths through the first transistor and the second transistor.

3. The driving circuit of claim 1, wherein the plurality of modulation signals has different timing.

4. The driving circuit of claim 1, further comprising a plurality of contact pads; the plurality of contact pads comprises at least one initial contact pad made according to an original applied specification; the control circuit receives the control signal through the initial contact pad.

5. The driving circuit of claim 4, wherein the plurality of contact pads further comprises a test contact pad; the control circuit receives the control signal through the test contact pad.

6. The driving circuit of claim 4, wherein the at least one initial contact pad is a contact pad of shift signal, a contact pad of clock signal, a contact pad of a latch signal, or a contact pad of a polar signal.

* * * * *